US012738952B2

(12) United States Patent
Sunny et al.

(10) Patent No.: US 12,738,952 B2
(45) Date of Patent: Sep. 15, 2026

(54) ENCODE INPUTS TO REDUCE ENERGY USAGES IN ANALOG COMPUTATION ACCELERATION

(71) Applicant: Micron Technology, Inc., Boise, ID (US)

(72) Inventors: Febin Sunny, Folsom, CA (US); Saideep Tiku, Folsom, CA (US); Shashank Bangalore Lakshman, Folsom, CA (US); Poorna Kale, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 153 days.

(21) Appl. No.: 18/501,664

(22) Filed: Nov. 3, 2023

(65) Prior Publication Data

US 2024/0171192 A1 May 23, 2024

Related U.S. Application Data

(60) Provisional application No. 63/383,200, filed on Nov. 10, 2022.

(51) Int. Cl.
*H03M 1/28* (2006.01)
*H03M 1/26* (2006.01)

(52) U.S. Cl.
CPC ............. *H03M 1/282* (2013.01); *H03M 1/26* (2013.01)

(58) Field of Classification Search
CPC ................................ H03M 1/282; H03M 1/26
See application file for complete search history.

(56) References Cited

U.S. PATENT DOCUMENTS

| | | | | |
|---|---|---|---|---|
| 11,048,434 | B2 * | 6/2021 | Kumar | G11C 11/419 |
| 11,281,972 | B2 * | 3/2022 | Shen | G06N 3/0675 |
| 11,347,477 | B2 * | 5/2022 | Sumbul | G06F 12/0246 |
| 11,604,996 | B2 * | 3/2023 | Schie | G06N 3/048 |
| 11,886,987 | B2 * | 1/2024 | Das | G06N 3/045 |
| 2018/0287915 | A1 | 10/2018 | Smith et al. | |
| 2019/0146864 | A1 | 5/2019 | Nair et al. | |

(Continued)

OTHER PUBLICATIONS

Extended European Search Report, EP20865896.3, mailed on Aug. 23, 2023.

(Continued)

*Primary Examiner* — Thomas D Alunkal
(74) *Attorney, Agent, or Firm* — Greenberg Traurig

(57) ABSTRACT

A device having: memory cells configured to store a set of first parameters as an input for an operation of multiplication and accumulation; digital to analog converters; an analog section of the operation of multiplication and accumulation; analog to digital converters; and a controller configured to analyze the set of first parameters to identify an encoding parameter for reduced energy consumption in processing the input. The device generates, using the digital to analog converters and according to the set of first parameters, analog inputs to the analog section of the operation of multiplication and accumulation. The analog section generates analog outputs responsive to the analog input. The device determines, using the analog to digital converters and according to the encoding parameter and the analog outputs, a set of second parameters as an output responsive to the input for the operation of multiplication and accumulation.

20 Claims, 6 Drawing Sheets

(56) References Cited

U.S. PATENT DOCUMENTS

| | | | | |
|---|---|---|---|---|
| 2020/0356847 | A1* | 11/2020 | Yi | G06F 17/15 |
| 2022/0101142 | A1* | 3/2022 | Tsai | G06N 3/048 |
| 2022/0164642 | A1* | 5/2022 | Li | H04B 10/58 |
| 2022/0350662 | A1* | 11/2022 | Ghodrati | G06N 3/044 |

OTHER PUBLICATIONS

F. Sunny, A. Mirza, M. Nikdast and S. Pasricha, “CrossLight: A Cross-Layer Optimized Silicon Photonic Neural Network Accelerator,” 2021 58th ACM/IEEE Design Automation Conference (DAC), 2021, pp. 1069-1074, doi: 10.1109/DAC18074.2021.9586161.

Febin Sunny, Mahdi Nikdast, and Sudeep Pasricha, “RecLight: A Recurrent Neural Network Accelerator with Integrated Silicon Photonics”, arXiv:2209.00084, submitted Aug. 31, 2022.

Kariuki, David, “How to Optimize the Performance of Your GPU in Cypto Mining.” Retrieved from the Internet on Jun. 22, 2023 <https://cryptomorrow.com/2019/06/12/gpu-miner-rig-performance-improvement>, Jun. 12, 2019.

* cited by examiner

ENCODE INPUTS TO REDUCE ENERGY USAGES IN ANALOG COMPUTATION ACCELERATION

RELATED APPLICATIONS

The present application claims priority to Prov. U.S. Pat. App. Ser. No. 63/383,200 filed Nov. 10, 2022, the entire disclosures of which application are hereby incorporated herein by reference.

TECHNICAL FIELD

At least some embodiments disclosed herein relate to reduction of energy usage in computations in general and more particularly, but not limited to, reduction of energy usage in multiplication and accumulation computations performed in analog forms.

BACKGROUND

Many techniques have been developed to accelerate the computations of multiplication and accumulation. For example, multiple sets of logic circuits can be configured in arrays to perform multiplications and accumulations in parallel to accelerate multiplication and accumulation operations. For example, photonic accelerators have been developed to use phenomenon in optical domain to obtain computing results corresponding to multiplication and accumulation. For example, a memory sub-system can use a memristor crossbar or array to accelerate multiplication and accumulation operations in electrical domain.

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
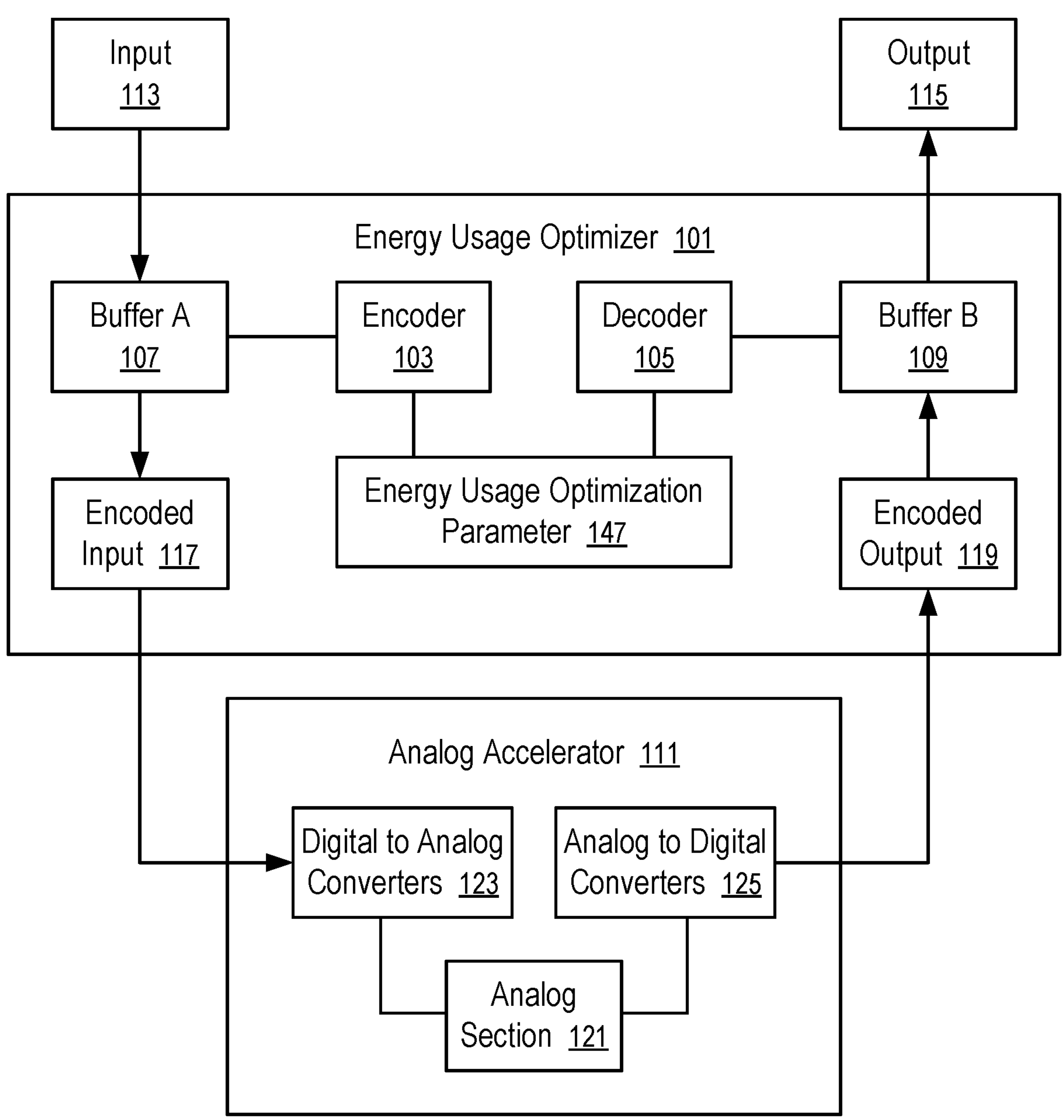
FIG. 1 shows an energy usage optimizer configured to reduce the energy expenditure in using an analog accelerator to obtain a computation result according to one embodiment.

At least some embodiments disclosed herein provide techniques of reducing the energy expenditure of an analog accelerator in processing a set of inputs via encoding the inputs.

To accelerate the computations of multiplication and accumulation, many multiplier-accumulator (MAC) units are configured to operate in analog forms. Digital inputs are converted into quantities in analog domains (e.g., optical signals, electrical signals) for manipulations that correspond to multiplication and accumulation; and quantities resulting from the manipulations are measured via converting to digital outputs for use in digital data processing systems.

However, digital to analog conversions can be energy intensive, especially in applications of deep learning involving a large amount of computations of multiplication and accumulation.

To reduce the energy expenditure in an analog accelerator, techniques disclosed herein transform received inputs to generate transformed inputs that use less energy expenditure for processing in the analog accelerator. Outputs generated from the transformed inputs can be transformed accordingly to obtain results corresponding to the processing of the received inputs.

Typically, energy expenditure of an analog accelerator in processing an input to generate an output can be dependent on an attribute of the input, such as the magnitude of the input. For example, in some types of analog accelerators (e.g., having a multiplier-accumulator (MAC) unit configured with microring resonators connected via a waveguide), the energy expenditure can increase as the magnitude of the input decreases. For example, in some types of analog accelerators (e.g., having a multiplier-accumulator (MAC) unit configured with a memristor crossbar or array), the energy expenditure can increase as the magnitude of the input increases. Thus, energy expenditure reduction can be achieved via transforming the input to adjust the attribute (e.g., magnitude) of the transformed input provided to the analog accelerator.

For example, an input parameter can be applied to a microring resonator via a tuning circuit. The energy expenditure in processing the input parameter via the microring resonator can increase as the magnitude of the input parameter decreases. Thus, it is advantageous to transform the input parameter to obtain a transformed input having an increased magnitude for processing in the microring resonator and transform the resulting output, generated by the accelerator, accordingly to recover or obtain the corresponding output parameter for the received input parameter.

Similarly, an input parameter can be applied to a memristor via a voltage driver driving a voltage having a magnitude corresponding to the input parameter to output a current. The energy expenditure in processing the input parameter can increase as the magnitude of the input parameter (and thus the voltage) increases. Thus, it is advantageous to transform the input parameter to obtain a transformed input having a decreased magnitude for processing via the memristor and transform the resulting output, generated by the accelerator, accordingly to recover or obtain the corresponding output parameter for the received input parameter.

Some operations (e.g., multiplication by a constant, bitwise shifting by a bit depth) can be applied to an input parameter to obtain a transformed input (with increased or decreased magnitude) such that the resulting output generated by an accelerator can be transformed by corresponding operations (e.g., division by the constant, reverse bitwise shifting by the bit depth) to recover the output parameter for the input parameter, without knowing the parameters (e.g., weights) configured in the accelerator.

When an analog accelerator is used to perform the computation of multiplication and accumulation between a column of input parameters and a matrix of weights, a same operation (e.g., multiplication by a same constant, bitwise shifting by a same bit depth) can be performed on the column of input parameters to obtain a transformed column of input parameters (with increased or decreased magnitudes by a same factor) such that the multiplication and accumulation results computed for the transformed column can be applied a corresponding operation (e.g., division by the same constant, reverse bitwise shifting by the same bit depth) to recover or obtain the multiplication and accumulation results for the received column of input parameters.

A logic circuit can be configured to analyze the column of input parameters to identify a suitable transformation to reduce the energy consumption by the analog accelerator in processing of the transformed column of input parameters. Optionally, the suitable transformation is identified without accuracy compromise while using as little energy as possible. Alternatively, a more aggressive transformation can be identified to further reduce energy expenditure with limited loss of accuracy, which typically can be tolerated in the context of deep learning. Optionally, a suitable transformation is identified to reduce the energy expenditure in the processing of the column of transformed input parameters, by further reducing the energy expenditure in the transition of computing elements (e.g., microring resonators or memristors) from the states of processing a prior set of inputs to the states of processing a subsequent set of inputs, as further discussed below.

FIG. 1 shows an energy usage optimizer configured to reduce the energy expenditure in using an analog accelerator to obtain a computation result according to one embodiment.

In FIG. 1, an analog accelerator 111 is configured to perform computations of multiplication and accumulation using an analog section 121. The analog accelerator 111 has digital to analog converters 123 to convert input parameters into analog inputs applied to the analog section 121, and analog to digital converters 125 to generate output parameters from the analog outputs produced by the analog section 121 responsive to the analog inputs.

In one example, the analog section 121 can include a memristor crossbar or array having memristors programmed to have resistance values representative of weights. The input parameters received in the analog accelerator 111 can be applied as voltages driven, onto rows of memristors, by voltage drivers controlled by the digital to analog converters 123; output currents of columns of memristors can be summed in lines; and the analog to digital converters 125 can digitize the summed currents in the lines to provide output parameters corresponding to the result of the multiplication and accumulation being applied to the input parameters and a matrix of weights stored in the memristors in the form of the programmed resistance values.

Figure 4:
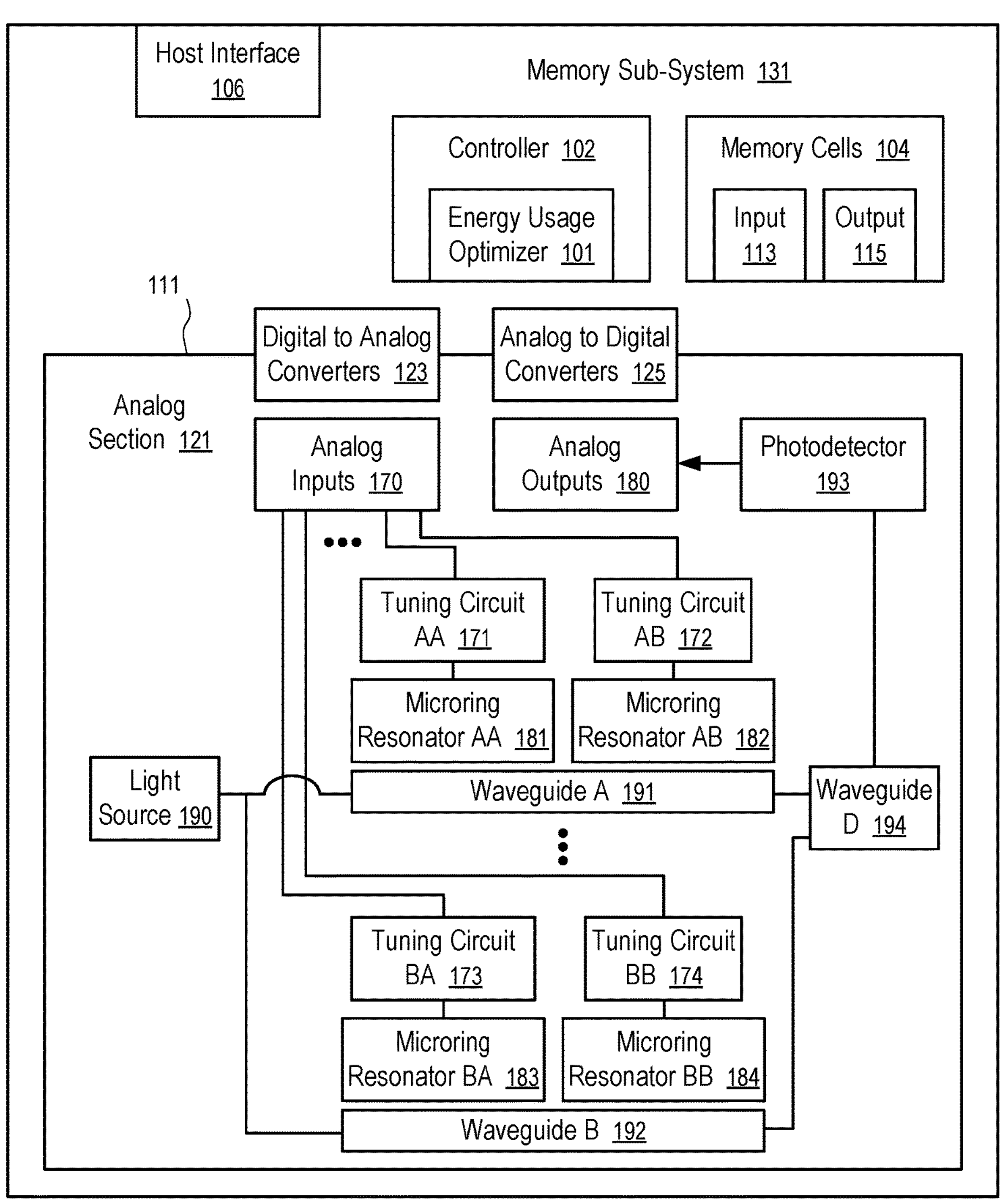
FIG. 4 shows a memory sub-system with an energy usage optimizer according to one embodiment.

In another example, the analog section 121 can include microring resonators connected to a waveguide to operate in an optical domain (e.g., as in FIG. 4). A set of tuning circuits can be used to apply a column of input parameters under the control of the digital to analog converters 123. A photodetector 193 can be used to convert the optical quantities in the waveguide into electrical signals, which are digitized by the analog to digital converters 125 to provide output parameters.

In general, an analog accelerator 111 having an analog section 121 implemented using another technology can also be used.

In FIG. 1, instead of providing an input (e.g., a column of input parameters to be multiplied by a weight matrix stored or implemented in the analog section 121) directly to the analog accelerator 111 for processing, an energy usage optimizer 101 is configured to generate an encoded input 117 via an encoder 103 to reduce the energy expenditure in generation of the output 115 for the input 113.

The energy usage optimizer 101 has a buffer 107 configured to buffer the input 113 for an analysis to identify an energy usage optimization parameter 147 for the encoder 103.

Consider an example of the analog section 121 having the characteristics of using more energy in processing input parameters of smaller magnitudes, such as an analog section 121 configured to use microring resonators as computing elements operating in the optical domain. The energy usage optimizer 101 can be configured to identify the energy usage optimization parameter 147 to increase input magnitudes via the encoder 103 generating the encoded input 117 from the input 113 in the buffer 107. For example, the encoder 103 can scale up or left shift bits of the input 113 according to the energy usage optimization parameter 147 to generate the encoded input 117. Thus, processing the encoded input 117 by the analog accelerator 111 uses less energy than processing the received input 113 directly.

Similarly, consider another example of the analog section 121 having the characteristics of using more energy in processing input parameters of larger magnitudes, such as an analog section 121 configured to use memristors as computing elements operating in electrical domain. The energy usage optimizer 101 can be configured to identify the energy usage optimization parameter 147 to reduce input magnitudes via an encoder 103 generating the encoded input 117 from the input 113 in the buffer 107. For example, the encoder 103 can scale down or right shift bits of the input 113 according to the energy usage optimization parameter 147 to generate the encoded input 117. Thus, processing the encoded input 117 by the analog accelerator 111 uses less energy than processing the received input 113 directly.

After the analog accelerator 111 generates encoded output 119 from the encoded input 117, the energy usage optimizer 101 can store the encoded output 119 in a buffer 109 for decoding using a decoder 105 according to the energy usage optimization parameter 147.

For example, when the encoder 103 is configured to scale up or left shift bits of the input 113 according to the energy usage optimization parameter 147 in generating the encoded input 117, the decoder 105 can scale down or right shift bits of the encoded output 119 according to the energy usage optimization parameter 147 to generate the output 115.

For example, when the encoder 103 is configured to scale down or right shift bits of the input 113 according to the energy usage optimization parameter 147 in generating the encoded input 117, the decoder 105 can scale up or left shift bits of the encoded output 119 according to the energy usage optimization parameter 147 to generate the output 115.

The output 115 generated by the decoder 105 can be provided as a computation result responsive to the input 113.

Figure 2:
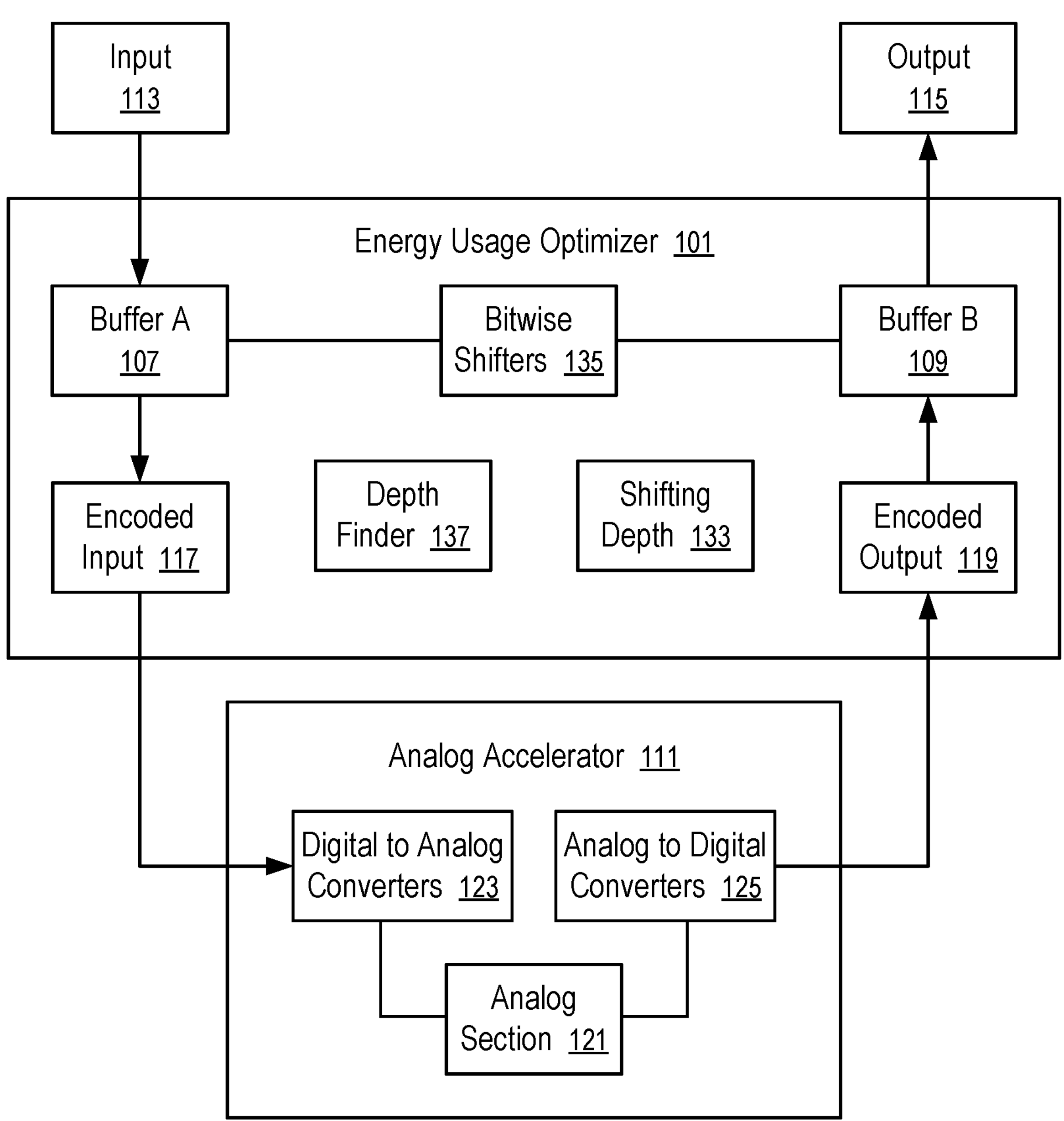
FIG. 2 shows a technique to shift inputs and outputs bitwise to reduce the energy expenditure in an analog accelerator according to one embodiment.

Optionally, the encoder 103 and the decoder 105 can be implemented via bitwise shifters as in FIG. 2 to reduce the computation workload and energy expenditure in performing the operations of the energy usage optimizer 101.

FIG. 2 shows a technique to shift inputs and outputs bitwise to reduce the energy expenditure in an analog accelerator according to one embodiment. For example, the energy usage optimizer 101 of FIG. 1 can be implemented in a way as illustrated in FIG. 2.

In FIG. 2, the energy usage optimizer 101 includes a depth finder 137 configured to identify a shifting depth 133 as an energy usage optimization parameter 147 used to encode the input 113 for the generation of the encoded input 117.

For example, to determine the output 115 of the multiplication and accumulation (e.g., a weight matrix represented by the analog section 121) with an input 113, the depth finder 137 can analyze the input 113 in the buffer 107 to determine the shifting depth 133.

For example, for each parameter in the input 113, the depth finder 137 can determine a maximum depth of shifting off trailing zeros in a binary representation of the parameter, such that when the parameter is shifted right bitwise to reduce magnitude according to the maximum depth of shifting, no significant bit of the parameter having a value of one is lost.

Similarly, for each parameter in the input 113, the depth finder 137 can determine a maximum depth of shifting off leading zeros in a binary representation of the parameter, such that when the parameter is shifted left bitwise to increase magnitude according to the maximum depth of shifting, no significant bit of the parameter having a value of one is lost.

To find an optimized shifting depth 133 for an input 113 having a plurality of parameters without losing accuracy, the depth finder 137 can be configured to find the smallest one of the maximum depths of shifting for the parameters in the input 113. Such a smallest maximum depth can be used as the shifting depth 133 in the generation of the encoded input 117 by the bitwise shifters 135 from the buffered input 113.

Figure 5:
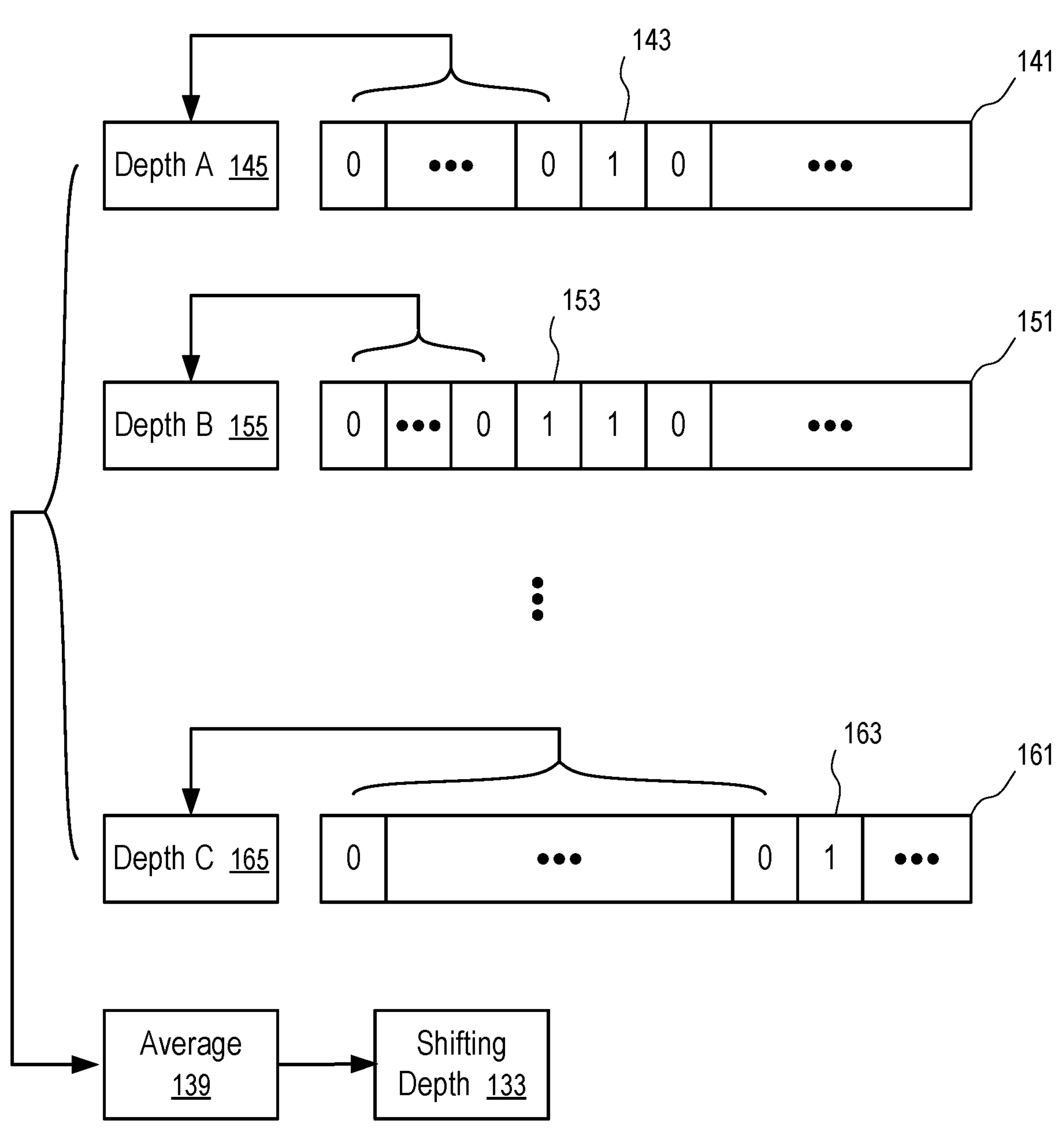
FIG. 5 illustrates a technique to determine a shifting depth to reduce the energy expenditure of an analog accelerator in processing a set of inputs according to one embodiment.

Alternatively, the depth finder 137 can compute an average of the maximum depths of shifting for the parameters in the input 113, as illustrated in FIG. 5. Such an average maximum depth can be used as the shifting depth 133 in the generation of the encoded input 117 by the bitwise shifters 135 from the buffered input 113.

Alternatively, the depth finder 137 can select, among the maximum depths of shifting of the parameters in the input, a shifting depth 133 that minimizes a hamming distance between a prior set of input parameters applied to the computing elements (e.g., microring resonators, memristors) in the analog section 121 and a subsequent set of input parameters be applied to the computing elements, to minimize or reduce the energy expenditure associated with the transition of states of the computing element between processing the prior set of input parameters and processing the subsequent set of input parameters.

When the shifting depth 133 is larger than the smallest one of the maximum depths of shifting for the parameters in the input 113, the output 115 generated according to the encoded output 119 can be different from an output generated by the analog accelerator 111 receiving the input 113 directly. However, since artificial neural networks are typically resilient to bit errors, such differences can be tolerated and generally do not have significant impact on the overall operations of the artificial neural networks.

After the analog accelerator 111 generates the encoded output 119 from the encoded input 117, the bitwise shifters 135 can be used by the energy usage optimizer 101 to perform reverse shifting on the encoded output 119 according to the shifting depth 133 to generate the output 115.

Figure 3:
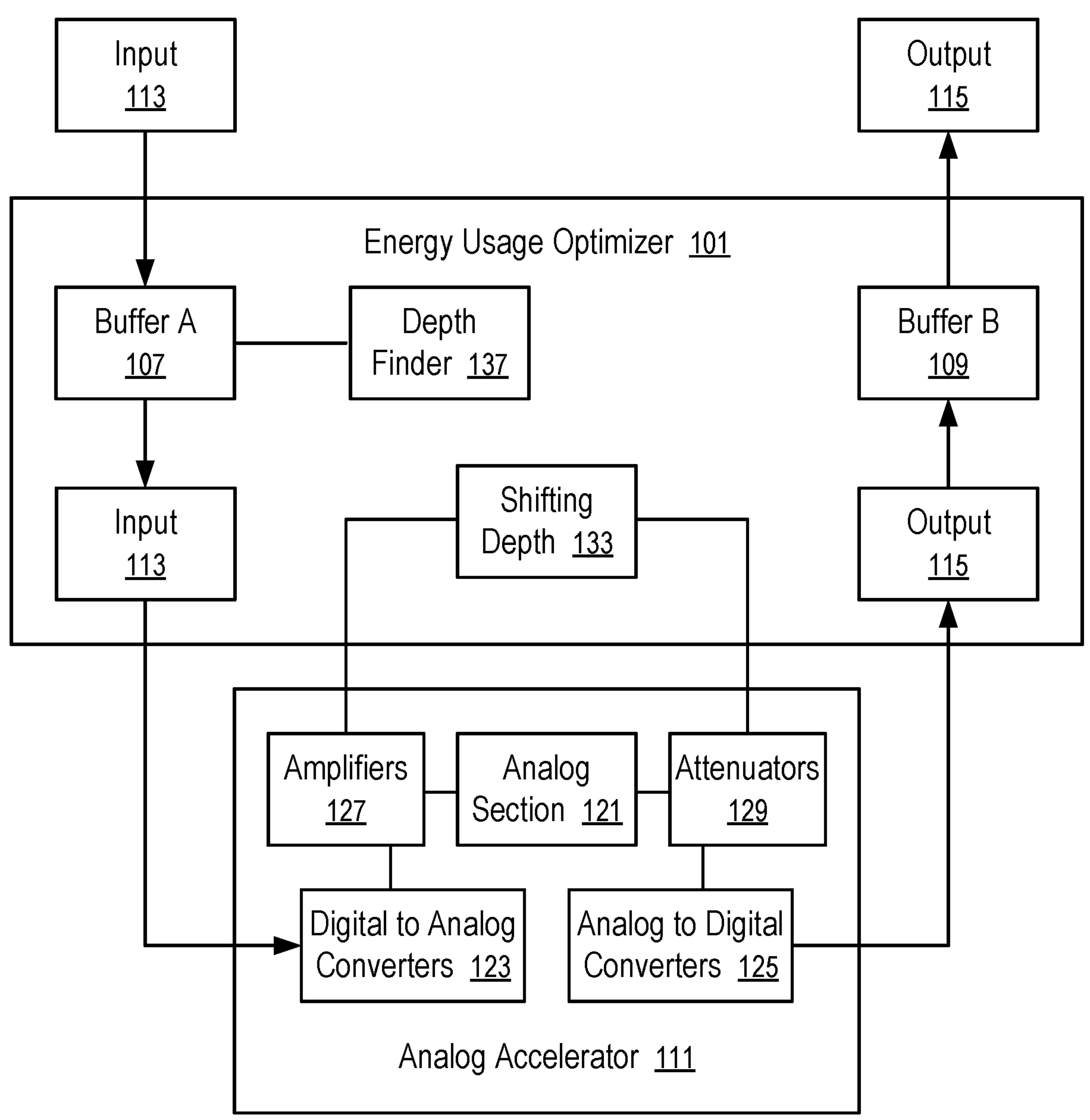
FIG. 3 shows a technique to amplify signals in an analog accelerator to reduce its energy expenditure in computation according to one embodiment.

Optionally, the operations of the bitwise shifters 135 can be replaced with corresponding operations of amplifiers and attenuators in analog domain, as illustrated in FIG. 3.

FIG. 3 shows a technique to amplify signals in an analog accelerator to reduce its energy expenditure in computation according to one embodiment.

In FIG. 3, the depth finder 137 of the energy usage optimizer 101 can operate in a way same or similar to the depth finder 137 of FIG. 2.

Instead of using bitwise shifters 135 to generate the encoded inputs 117 as in FIG. 2, the energy usage optimizer 101 of FIG. 3 uses the shifting depth 133, determined by the depth finder 137 as the energy usage optimization parameter 147, to control amplifiers 127 (or attenuators) to increase (or reduce) the magnitudes of the signals generated by the digital to analog converters 123 according to the inputs 113. Thus, the analog inputs provided by the amplifier 127 in FIG. 3 are substantially the same as the analog inputs provided by the digital to analog converters 123 in FIG. 2.

Similarly, the shifting depth 133, determined by the depth finder 137 as the energy usage optimization parameter 147, can be used to control attenuators 129 (or amplifiers) to reduce (or increase) the magnitudes of the signals generated by the analog section 121 in FIG. 3 before being converted via the analog to digital converters 125 to provide the output 115.

FIG. 4 shows a memory sub-system with an energy usage optimizer according to one embodiment. For example, the energy usage optimizer 101 of the memory sub-system 131 of FIG. 4 can be implemented as in FIG. 1, FIG. 2, or FIG. 3.

In FIG. 4, the memory sub-system 131 has a host interface 106 for a connection to a host system (e.g., a central processing unit (CPU), a system on a chip (Soc), a microprocessor).

The memory sub-system 131 can further include memory cells 104 operable to store inputs 113 and outputs 115 and a controller 102 configured via instructions (e.g., firmware), or logic circuit, or both to implement the energy usage optimizer 101 (e.g., as described above in connection with FIG. 1, FIG. 2, and FIG. 3). The memory cells 104 can be formed on one or more integrated circuit dies as non-volatile memory, or volatile memory.

The memory sub-system 131 of FIG. 4 includes an analog accelerator 111 having microring resonators 181, 182, . . . , 183, and 184. Optionally, the analog section 121 configured with optical processing using microring resonators 181, 182, . . . , 183, and 184 can be replaced with one or more multiplier-accumulator (MAC) units having memristor crossbars or arrays.

In FIG. 4, the analog section 121 has a light source 190 (e.g., a semiconductor laser diode, such as a vertical-cavity surface-emitting laser (VCSEL)) configured to feed light inputs to waveguides 191, . . . , 192. Each of the waveguides (e.g., 191 or 192) is configured with multiple microring resonators (e.g., 181, 182; or 183, 184) to change the magnitude of the light going through the respective waveguide (e.g., 191 or 192). A tuning circuit (e.g., 171, 172, 173, or 174) of a microring resonator (e.g., 181, 182, 183, or 184) can change resonance characteristics of the microring resonator (e.g., 181, 182, 183, or 184) through heat or carrier injection. Thus, the ratio between the magnitude of the light coming out of the waveguide (e.g., 191) to enter a combining waveguide 194 and the magnitude of the light going into the waveguide (e.g., 191) near the light source 190 is representative of the multiplications of attenuation factors implemented via tuning circuits (e.g., 171 and 172) of microring resonators (e.g., 181 and 182) in electromagnetic interaction with the waveguide (e.g., 191). The combining waveguide 194 sums the results of the multiplications performed via the lights going through the waveguides 191, . . . , 192. A photodetector 193 is configured to convert the combined optical outputs from the waveguide into analog outputs 180 in electrical domain. For example, a set of weights can be applied via inputs to the tuning circuits 171, . . . , 173; and a set of inputs can be applied via inputs to the tuning circuits 172, . . . , 174; and the output of the combining waveguide 194 to the photodetector 193 represents the multiplication and accumulation of the weights and inputs. Analog to digital converters 125 can convert the analog outputs 180 into encoded outputs 119 as in FIG. 2 (which is further converted by the energy usage optimizer 101 to the digital outputs 115 as in FIG. 2), or to digital outputs 115 as in FIG. 3 (e.g., when the analog accelerator 111 has attenuators 129 configured to decode analog outputs in analog domain before being converted by the analog to digital converter 125).

In FIG. 4, in response to the inputs 113 being written into a predetermined region of addresses of the memory cells 104, the controller 102 can use the analog accelerator 111 to generate the output 115. As in FIG. 1, FIG. 2, and FIG. 3, the energy usage optimizer 101 can analyze the input 113 to determine an energy usage optimization parameter 147 (e.g., shifting depth 133 in FIG. 2 or FIG. 3). The energy usage optimization parameter 147 can be used to generate an encoded input 117 for processing by the digital to analog converters 123, as in FIG. 1 or FIG. 2. Alternatively, encoding can be performed in analog domain (e.g., via amplifiers 127 as in FIG. 3).

For example, after generation of encoded inputs 117 in digital domain, the digital to analog converters 123 can convert parameters in the encoded input 117 to analog inputs 170; and analog inputs 170 are fed into tuning circuits 171, 172, . . . , 174 of the microring resonators 181, 182, . . . , 184 to generate outputs into the waveguide 191.

Alternatively, the energy usage optimization parameter 147 (e.g., shifting depth 133) can be used to control amplifiers 127 and attenuators 129 connected to the digital to analog converters 123 and the analog to digital converters 125 to adjust the magnitudes of electrical signals of the analog inputs 170 and analog outputs 180 as in FIG. 3. For example, the amplifiers 127 and attenuators 129 can be configured as part of the digital to analog converters 123 and the analog to digital converters 125 respectively and controlled via the shifting depth 133 for encoding and decoding in analog domain.

In general, any analog sections that have the characteristics of consuming different amounts of energy for operating on inputs of different attributes (e.g., magnitudes) can be used in the analog accelerators 111 in FIG. 1, FIG. 2, FIG. 3, and FIG. 4. Thus, implementations of analog accelerators 111 in FIG. 1, FIG. 2, FIG. 3, and FIG. 4 are not limited to techniques of using memristor crossbars, or microring resonators 183.

FIG. 5 illustrates a technique to determine a shifting depth to reduce the energy expenditure of an analog accelerator in processing a set of inputs according to one embodiment.

For example, the technique of FIG. 5 can be used in an energy usage optimizer 101 of FIG. 1, FIG. 2, FIG. 3, or FIG. 4 connected to an analog accelerator 111 having the characteristics of using more energy for inputs of smaller magnitudes (e.g., analog accelerator 111 configured with microring resonators 181 as computing elements).

In FIG. 5, an input 113 has parameters 141, 151, . . . , 161 (e.g., for multiplication and accumulation with a weight matrix implemented in the analog section 121). Each of the parameters 141, 151, . . . , 161 is represented in a binary form by a bit string of a fixed, predetermined bit width.

The depth finder 137 of the energy usage optimizer 101 can be configured to determine, for each parameter (e.g., 141, 151, or 161), a maximum depth (e.g., 145, 155, or 165) of leading zeros that can be left shifted off from the parameter (e.g., 141, 151, or 161), without losing a bit (e.g., 143, 153, or 163) having the value of 1.

The depth finder 137 can compute the average 139 of the maximum depths 145, 155, . . . , 165 of leading zeros in the parameters 141, 151, . . . , 161 as the shifting depth 133 usable as the energy usage optimization parameter 147 for the input 113 as a whole.

When the shifting depth 133 is used to left shift the parameters 141, 151, . . . , 161 to scale up the magnitudes of the parameters 141, 151, . . . , 161, some of the parameters having maximum depths of leading zeros smaller than the shifting depth 133 can lose one or more most significant bits. When the technique is used in the computations of artificial neural networks, the impact of losing one or more most significant bits on the overall computations of the artificial neural networks can be small, especially when the weight matrices of artificial neural network are trained via computations performed with similar energy usage optimization.

Alternatively, an alternative shifting depth 133 can be determined based on a statistical analysis or an information analysis of the maximum depths 145, 155, . . . , 165 of the parameters 141, 151, . . . , 161. For example, a minimum or a medium value of the maximum depths 145, 155, . . . , 165 can be selected as the shifting depth 133 for the input 113 as a whole. For example, one of the maximum depths 145, 155, . . . , 165 that minimizes the information distance (e.g., hamming distance) between two subsequent sets of parameters, with one set being fed into the same set of analog computing elements after a prior set without intervening parameters, to minimize the energy consumption in changing the states of the analog computing elements (e.g., microring resonators or memristors).

The shifting depth 133 determined using the technique of FIG. 5 can be used to left shift the input parameters 141, 151, . . . , 161 to generate an encoded input 117 (or an output of an amplifier 127) with increased magnitudes for analog accelerators 111 having the characteristics of consuming less energy for operating on parameters having larger magnitudes (e.g., analog accelerators 111 configured with microring resonators as computing elements).

Alternatively, the shifting depth 133 can be based on the maximum depths of trailing zeros of the input parameters 141, 151, . . . , 161 for reducing the magnitude of the input parameters, which corresponds to quantization of the input parameters 141, 151, . . . , 161 according to the shifting depths 133 selected or computed based on maximum depths of trailing zeros of the input parameters. The effect of the quantization on the accuracy of the outputs of an artificial neural network can be small or negligible. Such a shifting depth 133 can be used to right shift the input parameters 141, 151, . . . , 161 to generate an encoded input 117 (or an output of an attenuators connected to the outputs of the digital to analog converters 123) with decreased magnitudes for optimizing energy usages in analog accelerators 111 having the characteristics of consuming less energy for operating on parameters having smaller magnitudes (e.g., analog accelerators 111 configured with memristors as computing elements).

Figure 6:
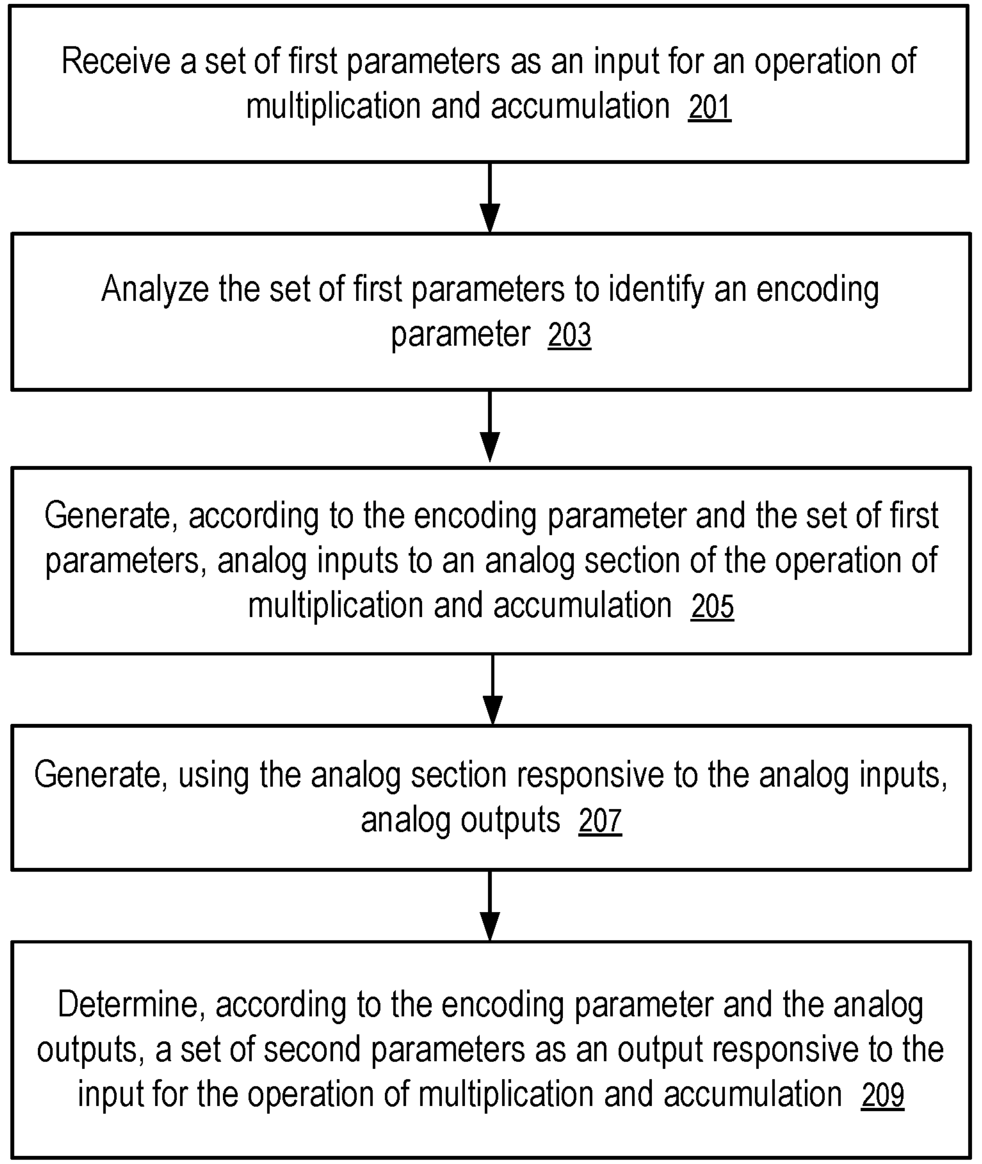
FIG. 6 shows a method to reduce the energy expenditure of an analog accelerator according to one embodiment.

FIG. 6 shows a method to reduce the energy expenditure of an analog accelerator according to one embodiment.

For example, the method of FIG. 6 can be implemented using an energy usage optimizers 101 of FIG. 1, FIG. 2, FIG. 3, and FIG. 4, and with the technique of FIG. 5.

At block 201, an energy usage optimizer 101 receives a set of first parameters (e.g., 141, 151, . . . , 161) as an input 113 for an operation of multiplication and accumulation.

For example, the input 113 can be a column of elements; and the operation of multiplication and accumulation can include the matrix multiplication of the column with a weight matrix implemented in an analog section 121.

At block 203, the energy usage optimizer 101 analyzes the set of first parameters (e.g., 141, 151, . . . , 161) to identify an encoding parameter (e.g., energy usage optimization parameter 147, shifting depth 133).

For example, the analog section 121 can have a characteristic of consuming energy at varying levels for processing input parameters having varying magnitudes; and the encoding parameter can be identified to reduce energy expenditure in the analog section 121 in generating analog outputs 180.

For example, the analog section 121 can have a characteristic of consuming more energy for processing input parameters having smaller magnitudes; and the encoding parameter can be identified to increase magnitudes of the analog inputs 170 and thus reduce the energy expenditure in generating analog outputs 180. For example, the analog section 121 can be configured with microring resonators 181, 182, . . . , 184 as computing elements for the operation of multiplication and accumulation in optical domain; and as a result, the analog section 121 can have the characteristics of consuming less energy for processing inputs of high magnitudes.

For example, the analog section 121 can have a characteristic of consuming more energy for processing input parameters having larger magnitudes; and the encoding parameter can be identified to decrease magnitudes of the analog inputs 170 and thus reduce the energy expenditure in generating analog outputs 180. For example, the analog section 121 can be configured with memristors as computing elements for the operation of multiplication and accumulation in electrical domain; and as a result, the analog section 121 can have the characteristics of consuming less energy for processing inputs of low magnitudes.

For example, in analyzing the set of first parameters (e.g., 141, 151, . . . , 161), the energy usage optimizer 101 can perform an analysis of leading zeroes (or trailing zeros) of the first parameters (e.g., 141, 151, . . . , 161).

For example, the energy usage optimizer 101 can be configured (e.g., via instructions, or logic circuits, or both), to identify a statistical parameter (e.g., average 139, minimum, medium) of maximum depths of leading zeroes (or trailing zeroes) of the first parameters (e.g., 141, 151, . . . , 161) and use the statistical parameter as a shifting depth 133 to generate analog inputs 170 for the analog section 121.

Optionally, the energy usage optimizer 101 can be configured (e.g., via instructions, or logic circuits, or both), to perform an information analysis to select one of maximum depths of leading zeroes (or trailing zeros) of the first parameters (e.g., 141, 151, . . . , 161) through minimizing an information distance between a second set of parameters to be fed into the computing elements (e.g., microring resonators, or memristors) in the analog section following a first set of parameters in processing the analog inputs.

At block 205, the energy usage optimizer 101 generates, according to the encoding parameter and the set of first parameters (e.g., 141, 151, . . . , 161), analog inputs 170 to an analog section 121 of the operation of multiplication and accumulation.

For example, the energy usage optimizer 101 can generate the analog inputs via: generating, using an encoder (e.g., 103 or bitwise shifters 135) controlled by the encoding parameter, a set of third parameters from the set of first parameters (e.g., 141, 151, . . . , 161) as an encoded input 117 in digital domain; and converting, using digital to analog converters 123, the set of third parameters to the analog inputs 170.

Alternatively, the encoding can be performed in analog domain. For example, after the digital to analog converters 123 convert the set of first parameters (e.g., 141, 151, . . . , 16) to first signals in the analog domain, amplifiers 127 (or attenuators) controlled by the encoding parameter can be used to amplify (or reduce) the first signals as the analog inputs 170.

At block 207, the energy usage optimizer 101 generates, using the analog section 121 responsive to the analog inputs 170, analog outputs 180.

For example, the analog section 121 can be configured to perform the operation of multiplication and accumulation in optical domain using microring resonators 181, 182, . . . , 184 connected to a waveguide 191.

For example, the analog section 121 can be configured to perform the operation of multiplication and accumulation in electrical domain using memristors connected in a crossbar or array.

At block 209, the energy usage optimizer 101 determines, according to the encoding parameter and the analog outputs 180, a set of second parameters as an output 115 responsive to the input 113 for the operation of multiplication and accumulation.

For example, after the analog to digital converters 125 convert the analog outputs 180 to a set of fourth parameters as an encoded output 119, the energy usage optimizer 101 can use a decoder (e.g., 105 or bitwise shifters 135) controlled by the encoding parameter to generate the set of second parameters as the output 115 from the encoded output 119 having the set of fourth parameters.

Alternatively, the decoding can be performed in analog domain. For example, after attenuators 129 (or amplifiers) controlled by the encoding parameter reduces (or amplifies) the analog outputs 180 as second signals, the analog to digital converters 125 convert the second signals to the set of second parameters in the output 115.

In general, a memory sub-system (e.g., 131 of FIG. 4) can be configured as a storage device, a memory module, or a hybrid of a storage device and memory module. Examples of a storage device include a solid-state drive (SSD), a flash drive, a universal serial bus (USB) flash drive, an embedded multi-media controller (eMMC) drive, a universal flash storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The memory sub-system (e.g., 131 of FIG. 4) can be installed in a computing system to accelerate multiplication and accumulation applied to data stored in the memory sub-system. Such a computing system can be a computing device such as a desktop computer, a laptop computer, a network server, a mobile device, a portion of a vehicle (e.g., airplane, drone, train, automobile, or other conveyance), an internet of things (IoT) enabled device, an embedded computer (e.g., one included in a vehicle, industrial equipment, or a networked commercial device), or such a computing device that includes memory and a processing device.

In general, a computing system can include a host system that is coupled to one or more memory sub-systems (e.g., 131 of FIG. 4). In one example, a host system is coupled to one memory sub-system. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

For example, the host system can include a processor chipset (e.g., processing device) and a software stack executed by the processor chipset. The processor chipset can include one or more cores, one or more caches, a memory controller (e.g., NVDIMM controller), and a storage protocol controller (e.g., PCIe controller, SATA controller). The host system uses the memory sub-system, for example, to write data to the memory sub-system and read data from the memory sub-system.

The host system can be coupled to the memory sub-system via a physical host interface. Examples of a physical host interface include, but are not limited to, a serial advanced technology attachment (SATA) interface, a peripheral component interconnect express (PCIe) interface, a universal serial bus (USB) interface, a fibre channel, a serial attached SCSI (SAS) interface, a double data rate (DDR) memory bus interface, a small computer system interface (SCSI), a dual in-line memory module (DIMM) interface (e.g., DIMM socket interface that supports double data rate (DDR)), an open NAND flash interface (ONFI), a double data rate (DDR) interface, a low power double data rate (LPDDR) interface, a compute express link (CXL) interface, or any other interface. The physical host interface can be used to transmit data between the host system and the memory sub-system. The host system can further utilize an NVM express (NVMe) interface to access components (e.g., memory devices) when the memory sub-system is coupled with the host system by the PCIe interface. The physical host interface can provide an interface for passing control, address, data, and other signals between the memory sub-system and the host system. In general, the host system can access multiple memory sub-systems via a same communication connection, multiple separate communication connections, or a combination of communication connections.

The processing device of the host system can be, for example, a microprocessor, a central processing unit (CPU), a processing core of a processor, an execution unit, etc. In some instances, the controller can be referred to as a memory controller, a memory management unit, or an initiator. In one example, the controller controls the communications over a bus coupled between the host system and the memory sub-system. In general, the controller can send commands or requests to the memory sub-system for desired access to memory devices. The controller can further include interface circuitry to communicate with the memory sub-system. The interface circuitry can convert responses received from the memory sub-system into information for the host system.

The controller of the host system can communicate with the controller of the memory sub-system to perform operations such as reading data, writing data, or erasing data at the memory devices, and other such operations. In some instances, the controller is integrated within the same package of the processing device. In other instances, the controller is separate from the package of the processing device. The controller or the processing device can include hardware such as one or more integrated circuits (ICs), discrete components, a buffer memory, or a cache memory, or a combination thereof. The controller or the processing device can be a microcontroller, special-purpose logic circuitry (e.g., a field programmable gate array (FPGA), an application specific integrated circuit (ASIC), etc.), or another suitable processor.

The memory devices can include any combination of the different types of non-volatile memory components and volatile memory components. The volatile memory devices can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, or a PLC portion of memory cells, or any combination thereof. The memory cells of the memory devices can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), spin transfer torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller (or controller for simplicity) can communicate with the memory devices to perform operations such as reading data, writing data, or erasing data at the memory devices and other such operations (e.g., in response to commands scheduled on a command bus by controller). The controller can include hardware such as one or more integrated circuits (ICs), discrete components, or a buffer memory, or a combination thereof. The hardware can include digital circuitry with dedicated (i.e., hard-coded) logic to perform the operations described herein. The controller can be a microcontroller, special-purpose logic circuitry (e.g., a field programmable gate array (FPGA), an application specific integrated circuit (ASIC), etc.), or another suitable processor.

The controller can include a processing device (processor) configured to execute instructions stored in a local memory. In the illustrated example, the local memory of the controller includes an embedded memory configured to store instructions for performing various processes, operations, logic flows, and routines that control operation of the memory sub-system, including handling communications between the memory sub-system and the host system.

In some embodiments, the local memory can include memory registers storing memory pointers, fetched data, etc. The local memory can also include read-only memory (ROM) for storing micro-code. While the example memory sub-system includes a controller, in another embodiment of the present disclosure, a memory sub-system does not include a controller, and can instead rely upon external control (e.g., provided by an external host, or by a processor or controller separate from the memory sub-system).

In general, the controller can receive commands or operations from the host system and can convert the commands or operations into instructions or appropriate commands to achieve the desired access to the memory devices. The controller can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices. The controller can further include host interface circuitry to communicate with the host system via the physical host interface. The host interface circuitry can convert the commands received from the host system into command instructions to access the memory devices as well as convert responses associated with the memory devices into information for the host system.

The memory sub-system can also include additional circuitry or components that are not illustrated. In some embodiments, the memory sub-system can include a cache or buffer (e.g., DRAM) and address circuitry (e.g., a row decoder and a column decoder) that can receive an address from the controller and decode the address to access the memory devices.

In some embodiments, the memory devices include local media controllers that operate in conjunction with the memory sub-system controller to execute operations on one or more memory cells of the memory devices. An external controller (e.g., memory sub-system controller) can externally manage the memory device (e.g., perform media management operations on the memory device). In some embodiments, a memory device is a managed memory device, which is a raw memory device combined with a local media controller for media management within the same memory device package. An example of a managed memory device is a managed NAND (MNAND) device.

The controller or a memory device can include a storage manager configured to implement storage functions discussed above. In some embodiments, the controller in the memory sub-system includes at least a portion of the storage manager. In other embodiments, or in combination, the controller or the processing device in the host system includes at least a portion of the storage manager. For example, the controller, the controller, or the processing device can include logic circuitry implementing the storage manager. For example, the controller, or the processing device (processor) of the host system, can be configured to execute instructions stored in memory for performing the operations of the storage manager described herein. In some embodiments, the storage manager is implemented in an integrated circuit chip disposed in the memory sub-system. In other embodiments, the storage manager can be part of the firmware of the memory sub-system, an operating system of the host system, a device driver, or an application, or any combination therein.

In one embodiment, an example machine of a computer system within which a set of instructions, for causing the machine to perform any one or more of the methods discussed herein, can be executed. In some embodiments, the computer system can correspond to a host system that includes, is coupled to, or utilizes a memory sub-system or can be used to perform the operations described above. In alternative embodiments, the machine can be connected (e.g., networked) to other machines in a LAN, an intranet, an extranet, or the internet, or any combination thereof. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a personal digital assistant (PDA), a cellular telephone, a web appliance, a server, a network router, a switch or bridge, a network-attached storage facility, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system includes a processing device, a main memory (e.g., read-only memory (ROM), flash memory, dynamic random access memory (DRAM) such as synchronous DRAM (SDRAM) or Rambus DRAM (RDRAM), static random access memory (SRAM), etc.), and a data storage system, which communicate with each other via a bus (which can include multiple buses).

Processing device represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device can also be one or more special-purpose processing devices such as an application specific integrated circuit (ASIC), a field programmable gate array (FPGA), a digital signal processor (DSP), network processor, or the like. The processing device is configured to execute instructions for performing the operations and steps discussed herein. The computer system can further include a network interface device to communicate over the network.

The data storage system can include a machine-readable medium (also known as a computer-readable medium) on which is stored one or more sets of instructions or software embodying any one or more of the methodologies or functions described herein. The instructions can also reside, completely or at least partially, within the main memory and within the processing device during execution thereof by the computer system, the main memory and the processing device also constituting machine-readable storage media. The machine-readable medium, data storage system, or main memory can correspond to the memory sub-system.

In one embodiment, the instructions include instructions to implement functionality corresponding to the operations described above. While the machine-readable medium is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to convey the substance of their work most effectively to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special-purpose circuitry, with or without software instructions, such as using application-specific integrated circuit (ASIC) or field-programmable gate array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:

receiving a set of first parameters as an input for an operation of multiplication and accumulation;

analyzing the set of first parameters to identify an encoding parameter;

generating, according to the encoding parameter and the set of first parameters, analog inputs to an analog section of the operation of multiplication and accumulation;

generating, using the analog section responsive to the analog inputs, analog outputs; and determining, according to the encoding parameter and the analog outputs, a set of second parameters as an output responsive to the input for the operation of multiplication and accumulation;

wherein the analog section has a characteristic of consuming more energy for processing input parameters having smaller magnitudes.

2. The method of claim 1, wherein the encoding parameter is identified to increase magnitudes of the analog inputs.

3. The method of claim 2, wherein the analog section includes microring resonators configured as computing elements for the operation of multiplication and accumulation in optical domain.

4. The method of claim 3, wherein the generating of the analog inputs includes:

generating, using an encoder controlled by the encoding parameter, a set of third parameters from the set of first parameters; and converting, using digital to analog converters, the set of third parameters to the analog inputs.

5. The method of claim 4, wherein the encoder includes bitwise shifters.

6. The method of claim 4, wherein the determining of the set of second parameters includes:

converting, using analog to digital converters, the analog inputs to a set of fourth parameters; and generating, using a decoder controlled by the encoding parameter, the set of second parameters from the set of fourth parameters.

7. The method of claim 3, wherein the generating of the analog inputs includes:

converting, using digital to analog converters, the set of first parameters to first signals; and amplifying the first signals, using amplifiers controlled by the encoding parameter, to generate the analog inputs.

8. The method of claim 7, wherein the determining of the set of second parameters includes:

reducing the analog outputs, using attenuators controlled by the encoding parameter, to second signals; and converting, using analog to digital converters, the second signals to the set of second parameters.

9. The method of claim 3, wherein the analyzing of the set of first parameters includes an analysis of leading zeroes of the first parameters.

10. The method of claim 9, wherein the analyzing of the set of first parameters includes identifying a statistical parameter of maximum depths of leading zeroes of the first parameters.

11. The method of claim 10, wherein the encoding parameter is representative of an average of the maximum depths of leading zeroes of the first parameters.

12. The method of claim 9, wherein the analyzing of the set of first parameters includes identifying a selected one of maximum depths of leading zeroes of the first parameters through minimizing an information distance between a second set of parameters to be fed into the microring resonators following a first set of parameters in processing the analog inputs.

13. A device, comprising:

memory cells configured to store a set of first parameters as an input for an operation of multiplication and accumulation;

digital to analog converters;

an analog section of the operation of multiplication and accumulation;

analog to digital converters; and a controller configured to:

analyze the set of first parameters to identify an encoding parameter;

generate, using the digital to analog converters and according to the set of first parameters, analog inputs to the analog section of the operation of multiplication and accumulation, wherein the analog section is configured to generate analog outputs responsive to the analog inputs; and determine, using the analog to digital converters and according to the encoding parameter and the analog outputs, a set of second parameters as an output responsive to the input for the operation of multiplication and accumulation;

wherein the analog section has a characteristic of consuming energy at varying levels for processing input parameters having varying magnitudes.

14. The device of claim 13, wherein the encoding parameter is identified to reduce energy expenditure in the analog section in generating the analog outputs.

15. The device of claim 14, wherein the analog section includes microring resonators or memristors configured as computing elements for the operation of multiplication and accumulation in optical domain.

16. The device of claim 15, wherein the controller is configured to perform a statistical analysis of leading zeroes or trailing zeros of the first parameters to determine the encoding parameter.

17. The device of claim 15, wherein the controller is further configured to perform an information analysis to select the encoding parameter to minimize an information distance between a second set of parameters to be fed into the computing elements following a first set of parameters in processing the analog inputs.

18. A non-transitory computer storage medium storing instructions which, when executed in a computing device, cause the computing device to perform a method, comprising:

receiving a set of first parameters as an input for an operation of multiplication and accumulation;

analyzing the set of first parameters to identify an encoding parameter;

generating, according to the encoding parameter and the set of inputs, a set of third parameters;

providing the set of third parameters to an analog accelerator having an analog section of the operation of multiplication and accumulation;

receiving, from the analog accelerator, a set of fourth parameters generated by the analog accelerator in response to the set of third parameters; and generating, according to the encoding parameter and the set of fourth parameters, a set of second parameters as an output responsive to the input for the operation of multiplication and accumulation;

wherein the analog section has a characteristic of consuming energy at varying levels for processing input parameters having varying magnitudes.

19. The non-transitory computer storage medium of claim 18, wherein the method further comprises:

performing a statistical analysis of leading zeroes or trailing zeros of the first parameters to determine the encoding parameter.

20. The non-transitory computer storage medium of claim 18, wherein the method further comprises:

performing an information analysis to select the encoding parameter via minimizing an information distance between a second set of parameters to be fed into computing elements in the analog section following a first set of parameters in processing the set of third parameters.

* * * * *